United States Patent
Jiang

(10) Patent No.: US 10,715,138 B1
(45) Date of Patent: Jul. 14, 2020

(54) OPEN DRAIN DRIVER CIRCUIT

(71) Applicant: TEXAS INSTRUMENTS INCORPORATED, Dallas, TX (US)

(72) Inventor: Junfeng Jiang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/551,183

(22) Filed: Aug. 26, 2019

(51) Int. Cl.
*H03K 17/687* (2006.01)
(52) U.S. Cl.
CPC .................. *H03K 17/6871* (2013.01)
(58) Field of Classification Search
CPC ................................................ H03K 17/6871
USPC .................. 327/108, 109, 110, 111, 112
See application file for complete search history.

(56) References Cited

U.S. PATENT DOCUMENTS

2010/0244906 A1\* 9/2010 Ishida .................... H05B 45/10
327/108

\* cited by examiner

*Primary Examiner* — John W Poos
(74) *Attorney, Agent, or Firm* — John R. Pessetto; Charles A. Brill; Frank D. Cimino

(57) ABSTRACT

An open drain driver circuit includes an output terminal, an input terminal, a first transistor, a second transistor, and a third transistor. The first transistor includes a first terminal coupled to the output terminal, and a second terminal coupled to a reference voltage source. The second transistor includes a first terminal coupled to a third terminal of the first transistor, a second terminal coupled to a power supply rail, and a third terminal coupled to the reference voltage source. The third transistor includes a first terminal coupled to the input terminal, a second terminal coupled to the reference voltage source, and a third terminal coupled to the third terminal of the first transistor.

16 Claims, 3 Drawing Sheets

OPEN DRAIN DRIVER CIRCUIT

BACKGROUND

Open drain drivers have many applications. For example, open drain drivers are commonly used to drive a logic signal onto a shared bus. One advantage of using an open drain driver in such an application is that the open drain driver is in a high impedance state when not driving the low signal onto the shared bus, which isolates the circuitry associated with the open drain driver from the shared bus. In such cases, where multiple circuits are sharing a bus, the supply voltages of the circuits may vary. Some circuits may operate with a low power supply voltage, while other circuits operate with a high power supply voltage.

SUMMARY

An open drain driver circuit that provides high switching speed at low power supply voltages is disclosed herein. In one example, an open drain driver circuit includes an output terminal, an input terminal, a first transistor, a second transistor, and a third transistor. The first transistor includes a first terminal coupled to the output terminal, and a second terminal coupled to a reference voltage source. The second transistor includes a first terminal coupled to a third terminal of the first transistor, a second terminal coupled to a power supply rail, and a third terminal coupled to the reference voltage source. The third transistor includes a first terminal coupled to the input terminal, a second terminal coupled to the reference voltage source, and a third terminal coupled to the third terminal of the first transistor.

In another example, an open drain driver circuit includes an output terminal, an input terminal, a first transistor, and a second transistor. The first transistor is coupled to the output terminal and is configured to pull the output terminal to ground responsive to a signal at the input terminal. The second transistor is coupled to the first transistor and is configured to short a control terminal of the first transistor to a power supply rail responsive to the signal at the input terminal.

In a further example, an open drain driver circuit includes an output terminal, an input terminal, a first transistor, a second transistor, a third transistor, a fourth transistor, a fifth transistor, a sixth transistor, a seventh transistor, an eighth transistor, a ninth transistor, and a tenth transistor. The first transistor includes a first terminal coupled to the output terminal, and a second terminal coupled to a reference voltage source. The second transistor includes a first terminal coupled to a third terminal of the first transistor, and a second terminal coupled to a power supply rail. The third transistor includes a first terminal coupled to the input terminal, a second terminal coupled to the reference voltage source, and a third terminal coupled to the third terminal of the first transistor. The fourth transistor includes a first terminal coupled to a third terminal of the second transistor, and a second terminal coupled to the power supply rail. The fifth transistor includes a first terminal coupled to the input terminal, a second terminal coupled to the reference voltage source, and a third terminal coupled to a third terminal of the fourth transistor. The sixth transistor includes a first terminal coupled to the third terminal of the fifth transistor, a second terminal coupled to the third terminal of the fifth transistor, and a third terminal coupled to the power supply rail. The seventh transistor includes a first terminal coupled to the third terminal of the first transistor, a second terminal coupled to the first terminal of the sixth transistor. The eighth transistor includes a first terminal coupled to the third terminal of the seventh transistor, a second terminal coupled to the third terminal of the seventh transistor, and a third terminal coupled to the reference voltage source. The ninth transistor includes a first terminal coupled to the third terminal of the second transistor, and a second terminal coupled to the third terminal of the second transistor. The tenth transistor includes a first terminal coupled to a third terminal of the ninth transistor, a second terminal coupled to the third terminal of the ninth transistor, and a third terminal coupled to the power supply rail.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Open drain outputs connected to a high voltage are usually slow when driven by circuitry operating at a low power supply voltage. To provide improved switching speed, some open drain circuits include a transistor driver that injects a large current into the open drain transistor. Other circuits use large transistors rather than a large control current. Yet other circuits include a charge pump that generates a high voltage for driving the open drain transistor. These solutions provide improved high voltage switching performance but increase circuit size and/or delay.

The open drain driver circuit disclosed herein includes circuitry that shorts the gate terminal of the open drain transistor to the power supply rail at the falling edge of an input signal. The short circuit quickly charges the gate of the open drain transistor to provide fast switching. The short circuit is removed as the gate voltage of the open drain transistor increases.

Figure 1:
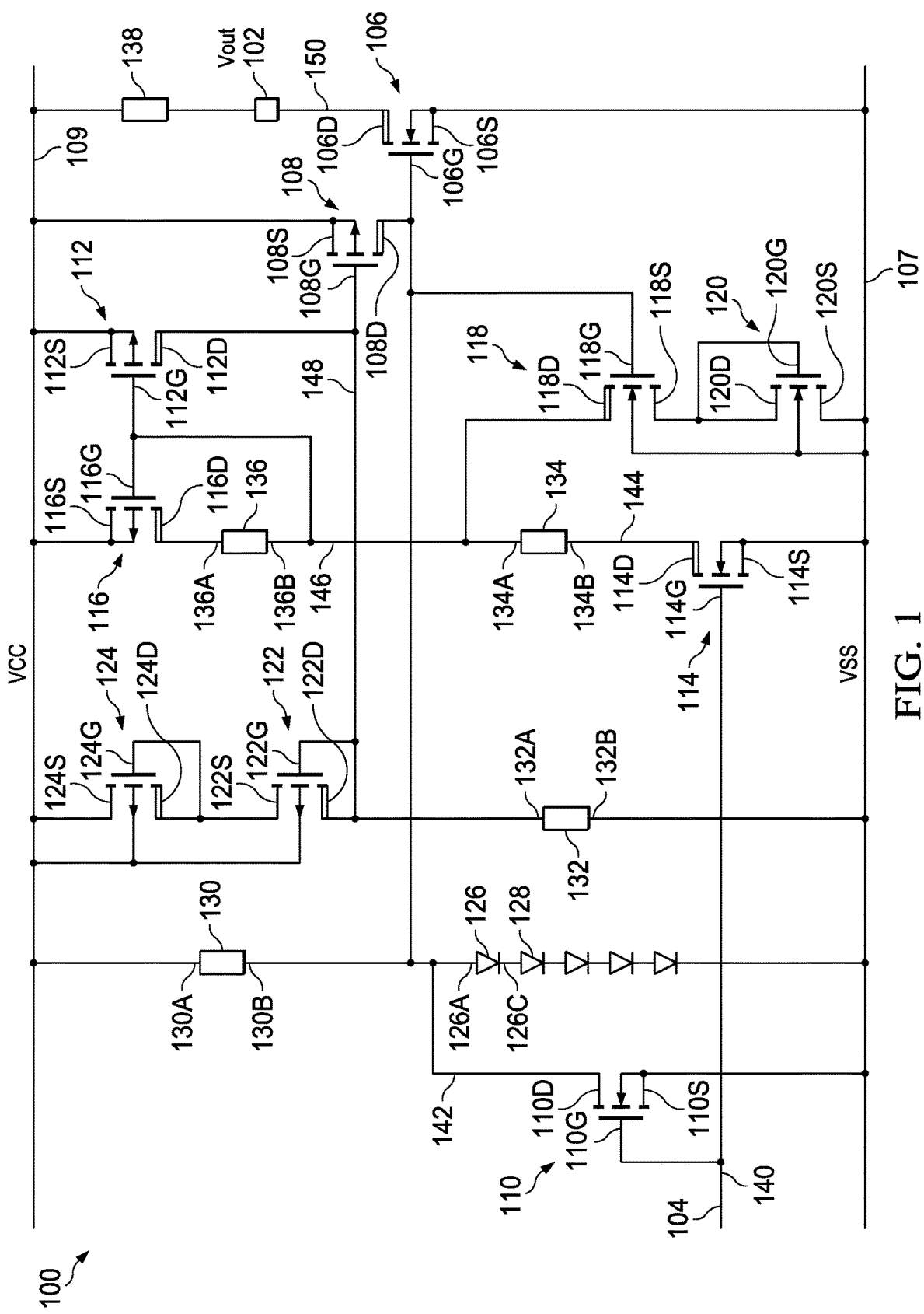
FIG. 1 shows a schematic diagram for an example open drain driver circuit in accordance with this description.

FIG. 1 shows a schematic diagram for an open drain driver circuit 100 in accordance with this description. The open drain driver circuit 100 includes an output terminal 102, an input terminal 104, a transistor 106, a transistor 108, a transistor 110, a transistor 112, a transistor 114, a transistor 116, a transistor 118, a transistor 120, a transistor 122, and a transistor 124. The transistor 106 is the open drain transistor that pulls the output terminal 102 to the reference voltage source 107 responsive to the signal 140 received at the input terminal 104. A drain terminal 106D of the transistor 106 is coupled to the output terminal 102, and a source terminal 106S of the transistor 106 is coupled to the reference voltage source 107. The reference voltage source 107 is ground in some implementations of the open drain driver circuit 100. The transistor 106 is an N-channel metal oxide semiconductor field effect transistor (MOSFET) in some implementations of the open drain driver circuit 100.

The transistor 108 is coupled to the transistor 106. The transistor 108 is turned on to short the gate terminal 106G (the control terminal) of the transistor 106 to the power supply rail 109 responsive to the signal 140 at the input terminal 104. The transistor 108 includes a drain terminal 108D coupled to the gate terminal 106G of the transistor 106 and a source terminal 108S coupled to the power supply rail 109. The transistor 108 is a P-channel MOSFET in some implementations of the open drain driver circuit 100.

The transistor 110 is coupled to the input terminal 104 and the transistor 106. The transistor 110 turns off the transistor 106 responsive to the signal 140 at the input terminal 104. The gate terminal 110G of the transistor 110 is coupled to the input terminal 104, the source terminal 110S of the transistor 110 is coupled to the reference voltage source 107, and the drain terminal 110D of the transistor 110 is coupled to the gate terminal 106G of the transistor 106. The 110D of the transistor 110 also coupled to the power supply rail 109 via the resistor 130. The resistor 130 includes a terminal 130A coupled to the power supply rail 109, and a terminal 130B coupled to the drain terminal 110D of the transistor 110 and the gate terminal 106G of the transistor 106. The transistor 110 is an N-channel MOSFET in some implementations of the open drain driver circuit 100.

The terminal 130B is also coupled to the reference voltage source 107 via a plurality of diodes connected in series. The diodes include a diode 126 and a diode 128. The diode 126 includes an anode terminal 126A that is coupled to the terminal 130B of the resistor 130, the gate terminal 106G of the transistor 106, and the drain terminal 110D of the transistor 110. The cathode terminal 126C of the diode 126 is coupled to the diode 128, and to the reference voltage source 107 via the diode 128 and any number of additional diodes.

The transistor 112 and the transistor 116 are arranged to form a current mirror circuit that turns off the transistor 108 as the voltage at the gate terminal 106G of the transistor 106 rises and the transistor 106 is turned on. The transistor 112 includes a source terminal 112S coupled to the power supply rail 109, and a drain terminal 112D coupled to the gate terminal 108G (the control terminal) of the transistor 108. The source terminal 116S of the transistor 116 is coupled to the power supply rail 109, and the gate terminal 116G of the transistor 116 is coupled to the gate terminal 112G of the transistor 112. The drain terminal 116D of the transistor 116 is coupled to the gate terminal 116G of the transistor 116 via a resistor 136. A terminal 136A of the resistor 136 is coupled to the drain terminal 116D of the transistor 116 and the terminal 136B of the resistor 136 is coupled to the gate terminal 116G of the transistor 116. The transistor 112 and the transistor 116 are P-channel MOSFETs in some implementations of the open drain driver circuit 100.

The transistor 114 is coupled to the input terminal 104 and the transistor 112. The transistor 114 turns the transistor 108 off by turning on the transistor 112 responsive to the signal 140 at the input terminal 104. The gate terminal 114G of the transistor 114 is coupled to the input terminal 104, the source terminal 114S of the transistor 114 is coupled to the reference voltage source 107, and the drain terminal 114D of the transistor 114 is coupled to the gate terminal 112G of the transistor 112 via the resistor 134. The resistor 134 includes a terminal 134A coupled to the gate terminal 112G of the transistor 112, and a terminal 134B coupled to the drain terminal 114D of the transistor 114. The transistor 114 is an N-channel MOSFET in some implementations of the open drain driver circuit 100.

The transistor 118 is coupled to the transistor 106 and the transistor 112. The transistor 118 turns on the transistor 112 and the transistor 116 responsive to the voltage at the gate terminal 106G of the transistor 106. In turn, the transistor 112 turns off the transistor 108. The gate terminal 118G of the transistor 118 is coupled to the gate terminal 106G of the transistor 106, the drain terminal 118D of the transistor 118 is coupled to the gate terminal 112G of the transistor 112, and the source terminal 118S of the transistor 118 is coupled to the reference voltage source 107 via the transistor 120. The transistor 118 is an N-channel MOSFET in some implementations of the open drain driver circuit 100.

The transistor 120 is coupled to the transistor 118 and to the reference voltage source 107. The transistor 120 is connected as a diode and couples the transistor 118 to the reference voltage source 107. The source terminal 120S of the transistor 120 is coupled to the reference voltage source 107. The gate terminal 120G of the transistor 120 is coupled to the drain terminal 120D of the transistor 120 and the source terminal 118S of the transistor 118. The transistor 120 is an N-channel MOSFET in some implementations of the open drain driver circuit 100.

The transistor 122 and the transistor 124 are diode-connected and couple the gate terminal 108G of the transistor 108 to the power supply rail 109. The drain terminal 122D of the transistor 122 is coupled to the gate terminal 122G of the transistor 122 and the gate terminal 108G of the transistor 108. The drain terminal 122D is also coupled to the reference voltage source 107 via a resistor 132. The resistor 132 includes a terminal 132A coupled to the drain terminal 122D of the transistor 122 and a terminal 132B coupled to the reference voltage source 107. The source terminal 122S is coupled to the power supply rail 109 via the transistor 124. The drain terminal 124D of the transistor 124 is coupled to the source terminal 122S of the transistor 122 and the gate terminal 124G of the transistor 124. The source terminal 124S of the transistor 124 is coupled to the power supply rail 109. The transistor 122 and the transistor 124 are P-channel MOSFETs in some implementations of the open drain driver circuit 100.

Figure 2:
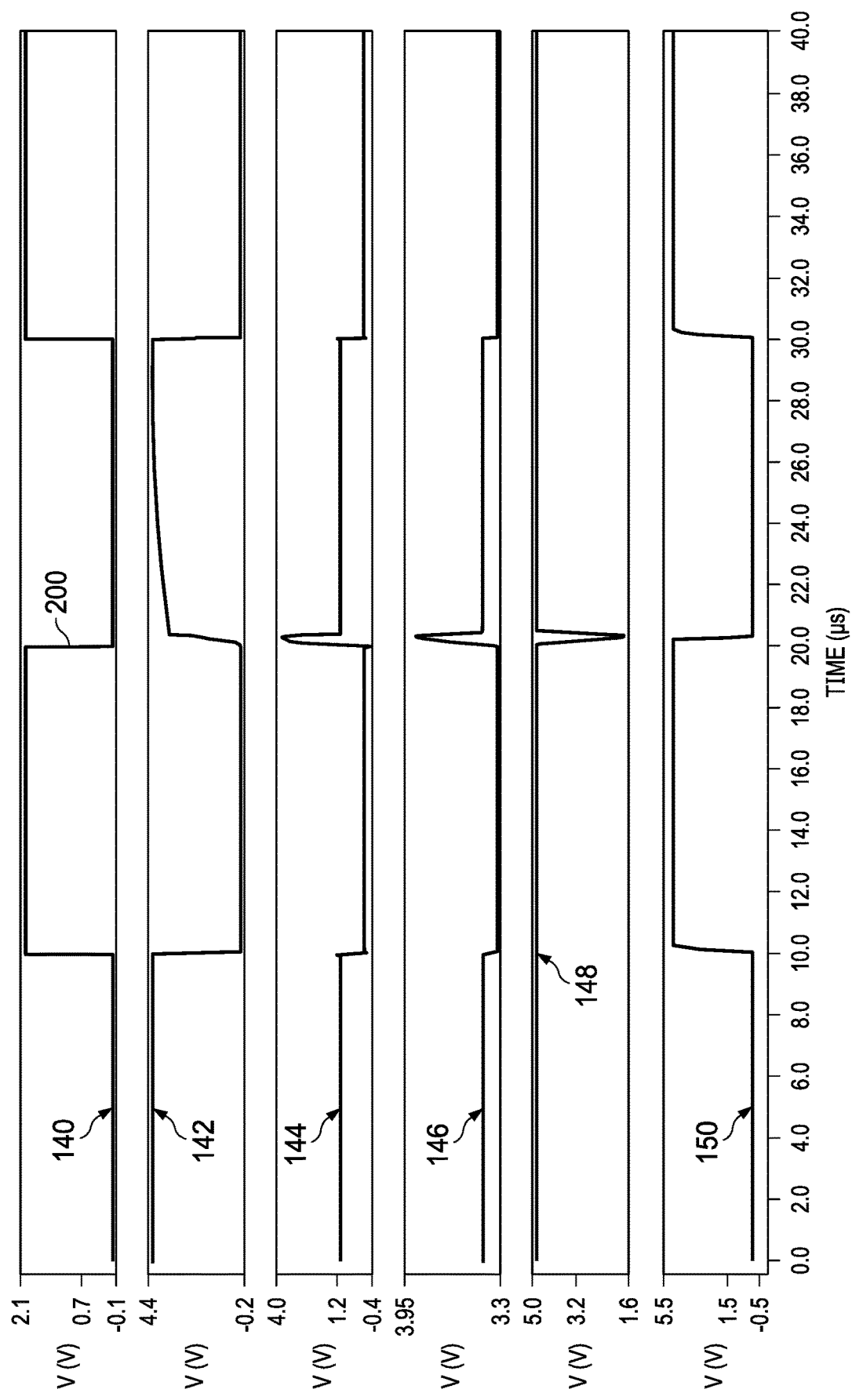
FIG. 2 shows example signals generated in an open drain driver circuit in accordance with this description.

FIG. 2 shows example signals generated in the open drain driver circuit 100 in accordance with this description. While the signal 140 at the input terminal 104 is "high," the transistor 110 and the transistor 114 are turned on, and the transistor 106 and the transistor 108 are turned off. The signal 150 at the output terminal 102 is pulled "high" by the resistor 138.

Figure 3:
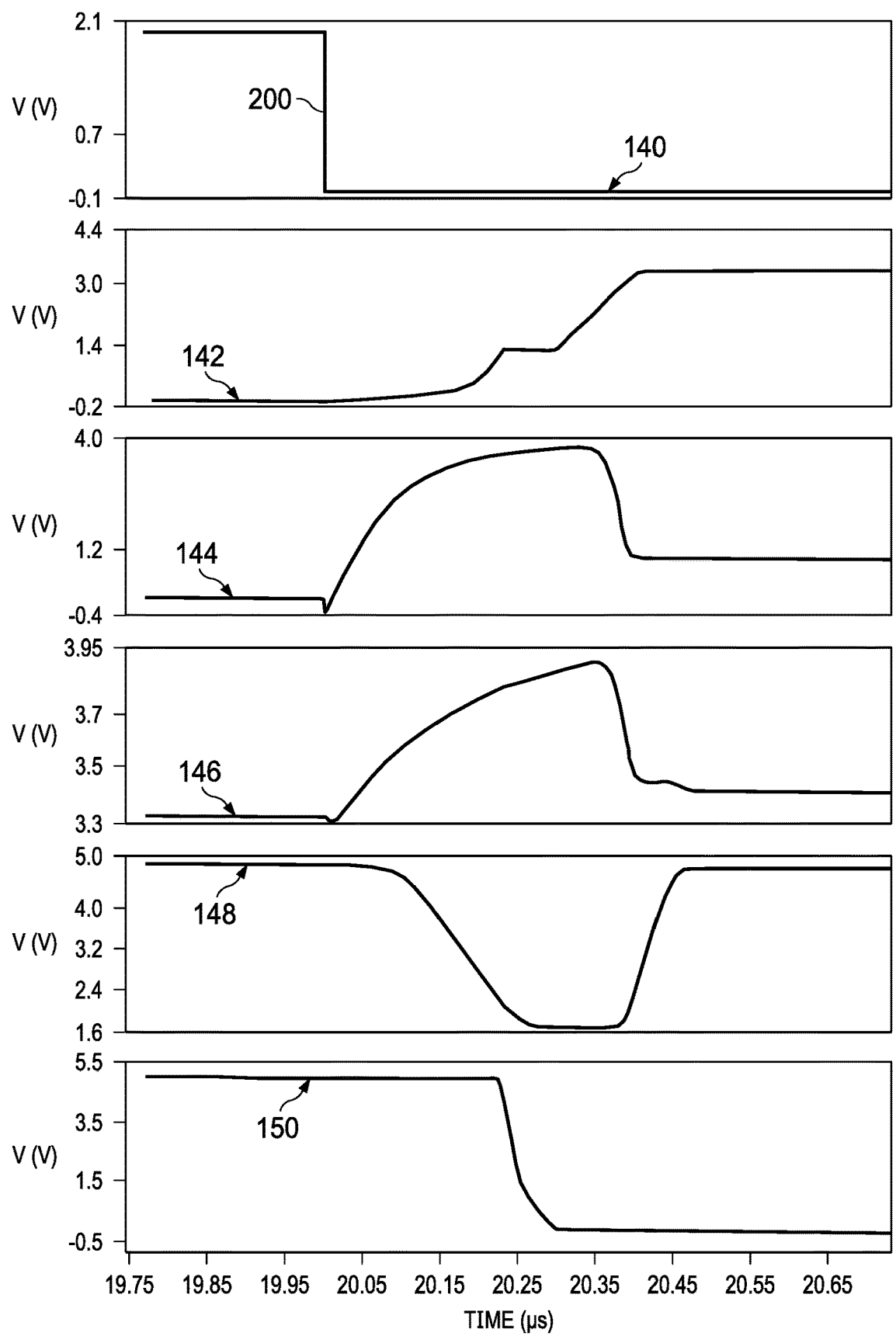
FIG. 3 shows example signals generated at a falling edge of an input signal received by an open drain driver in accordance with this description.

At 200, the signal 140 transitions from "high" to "low." FIG. 3 shows a detailed view of the signals generated in the open drain driver circuit 100 responsive to the transition from "high" to "low" of the signal 140. When the signal 140 transitions from "high" to "low," the transistor 110 and the transistor 114 turn off. Turning off the transistor 110 allows the signal 142 to begin rising slowly via the resistor 130. With the transistor 114 off, the signal 144 and the signal 146 rise, and as the signal 146 rises the transistor 112 is turned off. With the transistor 112 turned off, the signal 148 is pulled low by the resistor 132, which turns on the transistor 108. Turning on the transistor 108 shorts the gate terminal 106G of the transistor 106 to the power supply rail 109 causing the 142 to rise quickly, which turns on the transistor 106. When turned on, the transistor 106 pulls the signal 150 at the output terminal 102 low.

As the voltage on the signal 142 rises, the transistor 118 turns on and pulls down the signal 144 and the signal 146. The transistor 112 turns on responsive to the drop of the signal 146, which turns off the transistor 108 and disconnects the gate terminal 106G of the transistor 106 from the power supply rail 109. Thus, the transistor 108 turns on to quickly charge the gate terminal 106G of the 106 and turns off when the 106G has been sufficiently charged to turn on the 106.

Modifications are possible in the described embodiments, and other embodiments are possible, within the scope of the claims.

What is claimed is:

1. An open drain driver circuit, comprising:
    an output terminal;
    an input terminal;
    a first transistor comprising:
        a first terminal coupled to the output terminal; and
        a second terminal coupled to a reference voltage source;
    a second transistor comprising:
        a first terminal coupled to a third terminal of the first transistor;
        a second terminal coupled to a power supply; and
        a third terminal coupled to the reference voltage source; and
    a third transistor comprising:
        a first terminal coupled to the input terminal;
        a second terminal coupled to the reference voltage source; and
    a third terminal coupled to the third terminal of the first transistor;
    further comprising:
        a fourth transistor comprising:
            a first terminal coupled to the third terminal of the second transistor; and
            a second terminal coupled to the power supply; and
        a fifth transistor comprising:
            a first terminal coupled to the input terminal;
            a second terminal coupled to the reference voltage source; and
            a third terminal coupled to a third terminal of the fourth transistor.

2. The open drain driver circuit of claim 1, further comprising:
    a sixth transistor comprising:
        a first terminal coupled to the third terminal of the fifth transistor;
        a second terminal coupled to the third terminal of the fifth transistor; and
        a third terminal coupled to the power supply.

3. The open drain driver circuit of claim 1, further comprising:
    a sixth transistor comprising:
        a first terminal coupled to the third terminal of the first transistor;
        a second terminal coupled to the third terminal of the fourth transistor.

4. The open drain driver circuit of claim 3, further comprising:
    a seventh transistor comprising:
        a first terminal coupled to the third terminal of the sixth transistor;
        a second terminal coupled to the third terminal of the sixth transistor; and
        a third terminal coupled to the reference voltage source.

5. An open drain driver circuit, comprising:
    an output terminal;
    an input terminal;
    a first transistor comprising:
        a first terminal coupled to the output terminal; and
        a second terminal coupled to a reference voltage source;
    a second transistor comprising:
        a first terminal coupled to a third terminal of the first transistor;
        a second terminal coupled to a power supply; and
        a third terminal coupled to the reference voltage source; and
    a third transistor comprising:
        a first terminal coupled to the input terminal;
        a second terminal coupled to the reference voltage source; and
    a third terminal coupled to the third terminal of the first transistor;
    further comprising:
        a fourth transistor comprising:
            a first terminal coupled to the third terminal of the second transistor;
            a second terminal coupled to the third terminal of the second transistor; and
            a third terminal coupled to the power supply.

6. The open drain driver circuit of claim 5, further comprising:
    a fifth transistor comprising:
        a first terminal coupled to the third terminal of the fourth transistor;
        a second terminal coupled to the third terminal of the fourth transistor; and
        a third terminal coupled to the power supply.

7. The open drain driver circuit of claim 5, further comprising:
    a diode, comprising:
        a cathode terminal coupled to the reference voltage source; and
        an anode terminal coupled to the third terminal of the first transistor.

8. An open drain driver circuit, comprising:
    an output terminal;
    an input terminal;
    a first transistor coupled to the output terminal, and configured to pull the output terminal to ground responsive to a signal at the input terminal;
    a second transistor coupled to the first transistor, and configured to short a control terminal of the first transistor to a power supply responsive to the signal at the input terminal;
    a third transistor coupled to the second transistor, and configured to turn off the second transistor responsive to voltage at the control terminal of the first transistor; and
    a fourth transistor coupled to the input terminal and the third transistor, and configured to turn on the third transistor responsive to the signal at the input terminal.

9. The open drain driver circuit of claim 8, further comprising:
    a first diode connected transistor coupled to a control terminal of the second transistor; and
    a second diode-connected transistor coupled to the first diode connected transistor and the power supply.

10. An open drain driver circuit, comprising:
    an output terminal;
    an input terminal;

a first transistor coupled to the output terminal, and configured to pull the output terminal to ground responsive to a signal at the input terminal;

a second transistor coupled to the first transistor, and configured to short a control terminal of the first transistor to a power supply responsive to the signal at the input terminal;

a third transistor coupled to the second transistor, and configured to turn off the second transistor responsive to voltage at the control terminal of the first transistor; and a fourth transistor, connected as a diode, and coupled to the third transistor to form a current mirror circuit.

11. The open drain driver circuit of claim 10, further comprising a fifth transistor coupled to the fourth transistor, and configured to turn on the fourth transistor responsive to voltage at the control terminal of the first transistor.

12. The open drain driver circuit of claim 11, further comprising a sixth transistor coupled to the fifth transistor and a reference voltage source, and connected as a diode.

13. An open drain driver circuit, comprising:
an output terminal;
an input terminal;
a first transistor coupled to the output terminal, and configured to pull the output terminal to ground responsive to a signal at the input terminal; and
a second transistor coupled to the first transistor, and configured to short a control terminal of the first transistor to a power supply responsive to the signal at the input terminal;
further comprising a plurality of diodes connected in series, and coupled to the control terminal of the first transistor and a reference voltage source.

14. An open drain driver circuit, comprising:
an output terminal;
an input terminal;
a first transistor comprising:
 a first terminal coupled to the output terminal; and
 a second terminal coupled to a reference voltage source;
a second transistor comprising:
 a first terminal coupled to a third terminal of the first transistor; and
 a second terminal coupled to a power supply;
a third transistor comprising:
 a first terminal coupled to the input terminal;
 a second terminal coupled to the reference voltage source; and
 a third terminal coupled to the third terminal of the first transistor;
a fourth transistor comprising:
 a first terminal coupled to a third terminal of the second transistor; and
 a second terminal coupled to the power supply;
a fifth transistor comprising:
 a first terminal coupled to the input terminal;
 a second terminal coupled to the reference voltage source; and
 a third terminal coupled to a third terminal of the fourth transistor;
a sixth transistor comprising:
 a first terminal coupled to the third terminal of the fifth transistor;
 a second terminal coupled to the third terminal of the fifth transistor; and
 a third terminal coupled to the power supply;
a seventh transistor comprising:
 a first terminal coupled to the third terminal of the first transistor;
 a second terminal coupled to the first terminal of the sixth transistor; and
 a third terminal coupled to the reference voltage source;
an eighth transistor comprising:
 a first terminal coupled to the third terminal of the seventh transistor;
 a second terminal coupled to the third terminal of the seventh transistor; and
 a third terminal coupled to the reference voltage source;
a ninth transistor comprising:
 a first terminal coupled to the third terminal of the second transistor; and
 a second terminal coupled to the third terminal of the second transistor; and
a tenth transistor comprising:
 a first terminal coupled to a third terminal of the ninth transistor;
 a second terminal coupled to the third terminal of the ninth transistor; and
 a third terminal coupled to the power supply.

15. The open drain driver circuit of claim 14, further comprising a plurality of diodes connected in series, and coupled to the third terminal of the first transistor and the reference voltage source.

16. The open drain driver circuit of claim 14, further comprising:
a first resistor comprising:
 a first terminal coupled to the power supply; and
 a second terminal coupled to the third terminal of the first transistor;
a second resistor comprising:
 a first terminal coupled to the reference voltage source; and
 a second terminal coupled to the third terminal of the second transistor;
a third resistor comprising:
 a first terminal coupled to the third terminal of the fifth transistor; and
 a second terminal coupled to the second terminal of the seventh transistor; and
a fourth resistor comprising:
 a first terminal coupled to the first terminal of the sixth transistor; and
 a second terminal coupled to the second terminal of the sixth transistor.

* * * * *